United States Patent
Lin et al.

(10) Patent No.: US 9,466,665 B2
(45) Date of Patent: Oct. 11, 2016

(54) HIGH VOLTAGE DIODE

(71) Applicants: Xin Lin, Phoenix, AZ (US); Hongning Yang, Chandler, AZ (US); Jiang-Kai Zuo, Chandler, AZ (US)

(72) Inventors: Xin Lin, Phoenix, AZ (US); Hongning Yang, Chandler, AZ (US); Jiang-Kai Zuo, Chandler, AZ (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 0 days.

(21) Appl. No.: 14/697,195

(22) Filed: Apr. 27, 2015

(65) Prior Publication Data

US 2015/0228713 A1 Aug. 13, 2015

Related U.S. Application Data

(62) Division of application No. 13/656,122, filed on Oct. 19, 2012, now Pat. No. 9,040,384.

(51) Int. Cl.
| | |
|---|---|
| *H01L 23/58* | (2006.01) |
| *H01L 29/06* | (2006.01) |
| *H01L 29/861* | (2006.01) |
| *H01L 29/66* | (2006.01) |
| *H01L 27/12* | (2006.01) |

(52) U.S. Cl.
CPC ......... *H01L 29/063* (2013.01); *H01L 27/1207* (2013.01); *H01L 29/0692* (2013.01); *H01L 29/66204* (2013.01); *H01L 29/861* (2013.01)

(58) Field of Classification Search
CPC .............. H01L 29/063; H01L 29/861; H01L 29/0692; H01L 29/66204; H01L 27/1207
USPC .................................. 257/492, 493, E29.014
See application file for complete search history.

(56) References Cited

U.S. PATENT DOCUMENTS

| | | | |
|---|---|---|---|
| 5,241,210 A | 8/1993 | Nakagawa et al. | |
| 5,294,825 A | 3/1994 | Nakagawa et al. | |
| 5,378,920 A | 1/1995 | Nakagawa et al. | |
| 6,242,787 B1* | 6/2001 | Nakayama | H01L 21/8249 257/335 |
| 6,303,954 B1 | 10/2001 | Ohoka | |
| 7,466,006 B2 | 12/2008 | Khemka et al. | |
| 7,936,023 B1 | 5/2011 | Jang et al. | |
| 2009/0173966 A1* | 7/2009 | Cai | H01L 29/861 257/140 |
| 2011/0084354 A1 | 4/2011 | Honda et al. | |
| 2011/0140199 A1 | 6/2011 | Miyoshi et al. | |
| 2011/0316115 A1* | 12/2011 | Shimizu | H01L 27/0629 257/500 |

\* cited by examiner

*Primary Examiner* — Hung Vu

(57) ABSTRACT

A trench-isolated RESURF diode structure (100) is provided which includes a substrate (150) in which is formed anode (130, 132) and cathode (131) contact regions separated from one another by a shallow trench isolation region (114, 115), along with a non-uniform cathode region (104) and peripheral anode regions (106, 107) which define vertical and horizontal p-n junctions under the anode contact regions (130, 132), including a horizontal cathode/anode junction that is shielded by the heavily doped anode contact region (132).

20 Claims, 4 Drawing Sheets

US 9,466,665 B2

HIGH VOLTAGE DIODE

CROSS-REFERENCE TO RELATED APPLICATIONS

This application is a divisional of co-pending application Ser. No. 13/656,122, filed Oct. 19, 2012, which is incorporated herein by reference in its entirety.

BACKGROUND OF THE INVENTION

1. Field of the Invention

The present invention is directed in general to integrated circuit devices and methods for manufacturing same. In one aspect, the present invention relates to the manufacture and use of high voltage diode devices employing reduced surface field (RESURF) structures.

2. Description of the Related Art

High-voltage integrated circuits applications, such as high-voltage smart power applications, are constructed with integrated circuit diode devices which must be able to sustain high voltages (e.g., ninety volts or greater). Unfortunately, high voltage diodes typically consume a large silicon area which becomes a significant cost factor in more advanced technologies. In addition, there are typically tradeoffs posed when integrating diode devices between the on-resistance and breakdown voltage parameters of such devices, where the on-resistance is ideally kept low and the breakdown voltage is ideally kept high. For example, a design for a diode device which increases the device breakdown voltage typically also increases the on-resistance, which is undesirable.

BRIEF DESCRIPTION OF THE DRAWINGS

The present invention may be understood, and its numerous objects, features and advantages obtained, when the following detailed description is considered in conjunction with the following drawings, in which.

Figure 1:
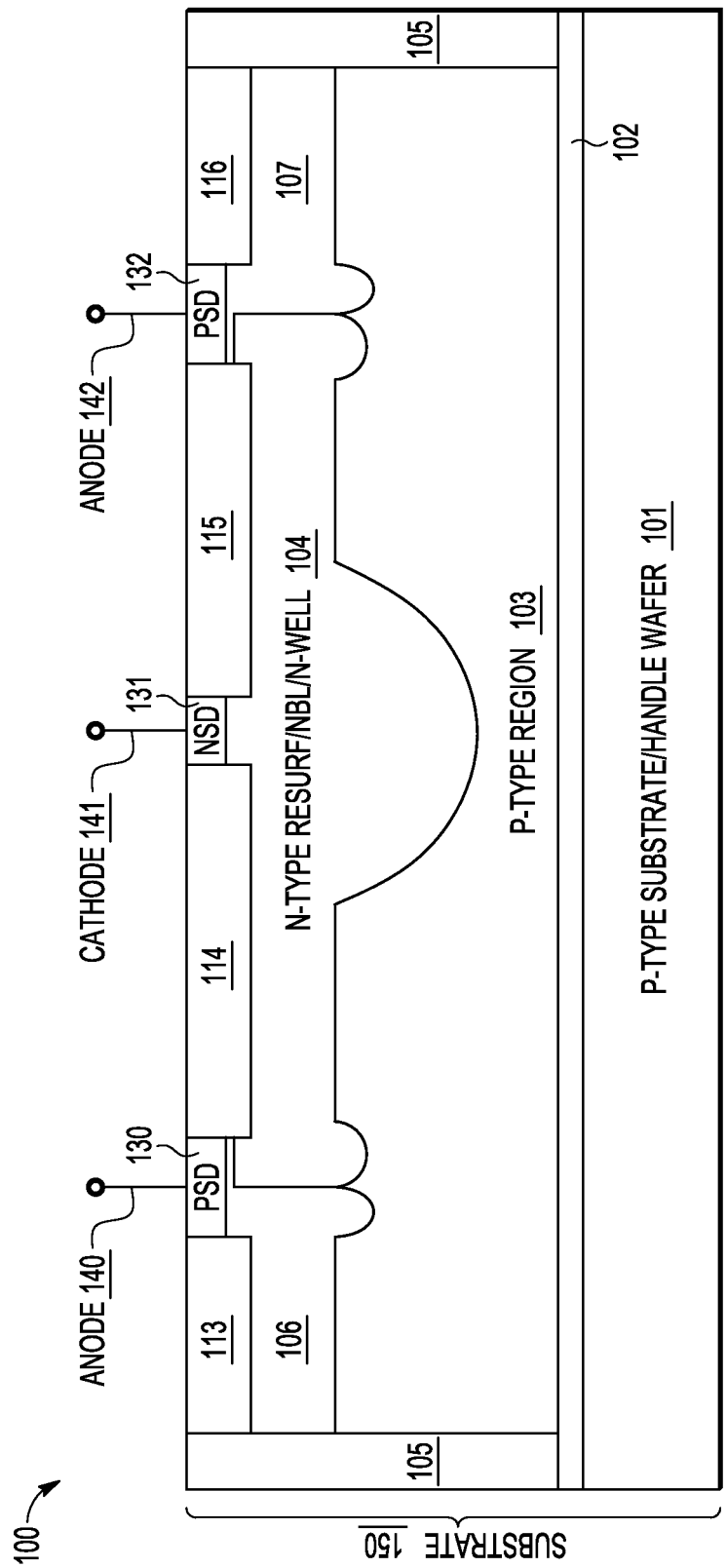
FIG. 1 is a partial cross-sectional view of a high voltage diode device having a RESURF anode structure formed to surround a cathode structure which extends laterally below the anode contact to form an anode-cathode junction that is shielded by anode contact near the surface in accordance with selected embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A trench-isolated high voltage diode structure is described for use with high voltage smart power applications, where the diode structure is isolated from other circuitry by a surrounding deep trench isolation structure and buried insulation layer, and includes anode and cathode contact regions separated from one another by a shallow trench isolation (STI) region. The cathode region includes a deep cathode region formed in the cathode active area, and a shallow cathode region which extends beyond the STI region between the cathode and anode contacts to define an upper, vertical p-n junction and lateral, horizontal p-n junction below the anode contact region. A continuous anode region surrounds the cathode region with peripheral p-well anode region on the sides of the cathode region. The anode region is formed in part of the anode active area and underneath the STI region between the anode contact and the deep trench isolation to function as the well tie and to serve as a RESURF layer to deplete the cathode region. As formed, the anode-cathode junction is shielded by anode contact near the surface to minimize the impact of surface charging on the device performance, and improve robustness.

In this disclosure, an improved system, apparatus, and fabrication method are described for a high voltage diode that address various problems in the art where various limitations and disadvantages of conventional solutions and technologies will become apparent to one of skill in the art after reviewing the remainder of the present application with reference to the drawings and detailed description provided herein. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of a high voltage diode device 100 having one or more peripheral anode structures 106, 107 formed to surround a cathode structure 104 having a deep central region and a shallow lateral extension region which extends below the anode contact 130, 132 so that the bottom and sides of the cathode structure 104 are enclosed by the continuous anode region 103, 106, 107 which completely depletes the cathode structure 104 to achieve high breakdown voltage. Though the various structures, well, and layer regions are illustrated in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. In addition, the depicted diode device structure 100 is formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

The depicted diode device 100 is shown as being formed on or as part of a substrate 150 which may be formed as a bulk semiconductor substrate or other substrate in which one or more additional semiconductor layers and/or well regions are formed using epitaxial semiconductor growth and/or selective doping techniques as described more fully hereinbelow. For example, the substrate 150 may be a semiconductor-on-inulator (SOI) type substrate which includes an semiconductor substrate 101, buried insulator layer 102, and p-type semiconductor substrate layer 103. The substrate 101 may be provided as a handling wafer layer formed of a material having first conductivity type impurities, such as an n-type substrate layer 101, at a predetermined doping level (e.g., approximately $2E15$ cm$^{-3}$), though any desired dopant type and/or concentration may be used. On the handling wafer 101, an insulator layer 102 and thin substrate seed layer (e.g., 1.5 um thick p-type substrate layer on top of insulator layer 102) may be formed to provide a seed layer for thick epitaxial growth of the p-type semiconductor substrate layer 103, thereby forming the initial SOI substrate structure 150. Alternatively, the SOT substrate structure 150 may be formed by bonding a donor wafer to a handle wafer. With this technique, the n-type semiconductor substrate 101 and at least part of the dielectric layer 102 are provided as a handle wafer which is bonded or otherwise attached to a donor wafer which includes part of the dielectric layer 102 and the p-type semiconductor layer 103 which may be formed in whole or in part as a p-type epitaxial layer. Alternatively and depending on the type of transistor being fabricated, the semiconductor substrate 150 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof. With selected bulk silicon substrate embodiments, the buried insulation layer 102 may be formed by implanting dielectric material (e.g., silicon oxide) at a predetermined energy and depth in the substrate 150.

In the substrate 150, an isolation structure around the active diode area includes patterned shallow trench isolation structure 113-116 and deep trench isolation structure 105 formed over the buried insulation layer 102. As will be appreciated, any desired technique may be used to etch and fill the trench openings with one or more dielectric (and semiconductor) materials. For example, the deep trench isolation structure 105 may be formed in the substrate 150 to surround and isolate the various well regions and active areas in the diode device 100. In selected embodiments, the deep trench isolation structures 105 are formed using a first etch mask to etch deep trench openings through the underlying buried insulation layer 102 (e.g., by applying anisotropic etching to patterned trench etch mask layer), filling the deep trench openings at the periphery with one or more insulating dielectric layers, filling the deep trench openings in the center with heavily doped n-type poly (not shown) and then polishing or planarizing the filling layers down to the surface of the substrate 150. In similar fashion, a separate trench mask and etch process may be used to form the shallow trench isolation structure 113-116 in an upper portion of the substrate 150. For example, shallow trench openings may be formed by applying anisotropic etching to a patterned trench etch mask layer, and then forming one or more insulating dielectric layers in the shallow trench openings to form the shallow trench isolation (STI) structures 113-116. The positioning of the STI structures 113-116 is controlled to place an STI structure (e.g., 114 and 115) between a cathode 141 and anode 140 and 142 so that the STI structure is the only isolation between the cathode and anode contacts. For example, the STI structures 113, 116 may formed as a single continuous STI structure that loops around the periphery of the high voltage diode device 100 between the anode contact 130, 132 and the deep trench isolation structure 105. In similar fashion, the STI structures 114, 115 may formed as a single continuous STI structure that loops around the high voltage diode device 100 between the cathode contact 131 and the anode contact 130, 132. As described hereinbelow, the positioning of the STI structures 113-116 is controlled to locate the STI structure (e.g., 114 and 115) adjacent to the upper or vertical p-n junction between the cathode and anode regions.

In the active area for the diode device 100, one or more first semiconductor layers 103 is formed having a predetermined thickness with a material having a first conductivity type (e.g., p-type). For example, the first semiconductor layer(s) 103 may be formed in whole or in part with an epitaxial p-type layer 103 having a thickness in the range of approximately 1.5-7 um with a p-type doping concentration (e.g., approximately $1E14$ to $1E16$ cm$^{-3}$, and more preferably $2E15$ cm$^{-3}$), though other dopant types, thicknesses, and/or concentrations may be used. In the first semiconductor layer 103, the anode and cathode regions are separately formed to define a p-n junction between a p-type RESURF anode layer and an n-type shallow cathode layer, where the p-type RESURF anode layer extends towards the cathode contact to help deplete the cathode region under reverse bias.

In selected embodiments, the cathode region 104 is formed to surround or sit below one or more cathode contact regions 131, and includes a deep cathode region formed in (and near) the cathode active area and a shallow cathode region which extends beyond the STI region 114, 115. In selected implantation embodiments, the cathode region 104 may be formed with a sequence of n-type implants and associated implant masks, including a first high energy n-well implant to a predetermined implant energy and dopant concentration (e.g., $5E15$ to $5E17$ cm$^{-3}$) so as to form a deep cathode region located in an upper portion of the substrate 150 to surround or sit below the subsequently formed N+ cathode contact region(s) 131. The high energy n-well implant may be performed using an implant mask that covers or masks the substrate 150 except for all or part of the subsequently formed N+ cathode contact region(s) 131. In some embodiment, the high energy n-well implant might extend beyond the cathode active region into part of STI regions 114, 115. By implanting n-type impurities through the patterned (STI) structures 114-115, the resulting profile of the high energy n-well region may include a profile bulge below the cathode active area where the implanted impurities have more channeling effect. As disclosed herein and illustrated in FIG. 1, the high energy n-well implant for thrilling the deep cathode region may be positioned with implant masks so that that the deep cathode region is disposed in the cathode contact region and adjoining portions of the STI regions 114, 115. However, it will be appreciated that implant mask and energy may be controlled so that the deep cathode region is only disposed in the center of the cathode contact region, and does not extend to adjacent STI regions 114 and 115. In these embodiments, the shallow cathode region still surrounds and contacts the deep cathode region.

In addition, one or more additional n-type implants may be applied to further define the cathode region 104, including implanting a shallow cathode region using a second implant mask to implant material having the second conductivity type impurities (e.g., shallow n-type region with a peak dopant concentration of 5E16 $cm^{-3}$) in a predetermined upper region of the substrate 150 so as to extend beyond the patterned (STI) structures 114-115 to a region below part of the anode contact regions 130, 132. To control the lateral extent of the shallow cathode region, the second implant mask may cover or mask at least part of the substrate area between the subsequently formed P+ anode contact region (s) 130, 132 and the deep trench isolation structure 105. Alternatively, the second implant mask may expose this substrate area in embodiments where p-type anode implants having a higher doping concentration were previously formed. If desired, the second implant mask may cover or mask the area where the high energy n-well implant was performed. In further embodiment, the second implant mask may expose the area receiving the high energy n-well implant. As disclosed herein, the low energy n-well implant for forming the shallow cathode region(s) may be positioned with implant masks so that the shallow cathode region is disposed across the entire region except the area receiving the high energy n-well implant. In this case, the p-type well implant used to form the anode RESURF region must be heavier than the low energy n-well implant. In other embodiments, the low energy n-well implant is disposed across the entire diode structure, in which case the p-type well implant used to form the anode RESURF region must be heavier than the low energy n-well implant, and the deep cathode region is formed by two n-well implants, i.e., high energy n-well implant and low energy n-well implant. In other embodiments, the low energy n-well implant is disposed in the cathode region except for the area receiving the high energy n-well implant. In yet other embodiments, the low energy n-well implant is disposed in the entire cathode area including the deep cathode region.

However formed, the doping concentration, implant energy, and junction depth of the sequence of n-type implants are selected and controlled to form the cathode region 104 so that the deep cathode region contains or sits below the cathode contact region 131 and so that the shallow cathode region extends past the STI regions 114, 115 leading to a lateral or horizontal p-n junction at the side or periphery of the shallow extension region 104 and below the anode contact region(s) 130, 132. Yet another implant mask and implantation process are used to form the cathode contact regions 131 in the cathode region 104 with material having second conductivity type impurities (e.g., N++ source/drain region) in a predetermined upper region of the substrate 150.

Adjacent to each cathode region 104, the anode region is formed to include one or more anode contact regions 130, 132 and peripheral anode region(s) 106, 107 having the first conductivity type (e.g., p-type). Each peripheral anode region 106, 107 may be formed with a sequence of p-type implants and associated implant masks, including a first p-well implant to a predetermined implant energy and dopant concentration (e.g., 1E16 to 1E19 $cm^{-3}$) so as to be located in an upper peripheral portion of the substrate 150 adjacent to the deep trench isolation structure 105 to contact the subsequently formed P+ anode contact region(s) 130, 132. The p-well implant may be performed using an implant mask that covers or masks the substrate 150 except for part of the subsequently formed P+ anode contact region(s) 130, 132 and the area adjacent to the deep trench isolation structure 105. In this way, the p-well implant forms a p-type well tie, and functions as a RESURF layer to assist with fully depleting the cathode region 104. In addition, one or more additional p-type implants may be applied to further define each peripheral anode region 106, 107, including implanting an anode contact region 130, 132 using a second implant mask to implant material having the first conductivity type impurities (e.g., P++ source/drain region) in a predetermined upper region of the substrate 150. In addition, anode contact regions may be implanted using the second implant mask to implant a high dose of impurities having the first conductivity type (e.g., P++ LDD regions) in a predetermined upper region of the substrate 150. However formed, the doping concentration, implant energy, and junction depth of the sequence of p-type implants are selected and controlled to form the peripheral anode region(s) 106, 107 to a predetermined depth and concentration (e.g., 2.2 um deep with a peak concentration of approximately 1E18 $cm^{-3}$) so that they contain the anode contact regions 130, 132 which extend over the shallow cathode layer. The doped p-type region between the anode contacts 130, 132 and the deep trench isolation structure 105 defines an anode/cathode junction with an upper, vertical p-n junction and lateral, horizontal p-n junction below the anode contact regions 130, 132. In this way, the entire cathode region 104 is surrounded by the continuous anode region 103, 106, 107.

Though the anode and cathode contact regions 130-132 can be formed using photoresist implant masks to selectively diffuse or implant the appropriate impurities, it will be appreciated that other masking or selective diffusion or implantation techniques may also be used so that these regions are all heavily doped in order to allow for good ohmic contact, and thus may be called ohmic regions on which metal contacts (not shown) may be formed. During back-end processing, one or more anode metallization layer (s) 140, 112 and cathode metallization layer(s) 141 are formed to connect the anode(s) and cathode, respectively.

With the configuration of the diode device 100, the STI regions 114, 115 provide the only isolation between the cathode contact 131 and anode contacts 130, 132. The RESURF action is promoted by the peripheral anode regions 106, 107 which are formed with one or more p-type implants into the anode active area and the region adjacent to the deep trench 105. In this way, the horizontal and vertical anode-cathode junctions are shielded by the anode contact(s) 130, 132 near the substrate surface to minimize the impact of surface charging on the device performance, and improve the device robustness. In addition, the formation of the deep cathode region with the high energy n-well implant into the central cathode area helps sustain the vertical field, while the formation of the shallow cathode region to extend laterally to the peripheral anode region helps sustain large lateral fields. By thus forming the cathode region 104 to be surrounded by the continuous anode region 103, 106, 107 to form a large p-n junction, the peripheral anode regions 106, 107 deplete the cathode region 104 to help evenly distribute the potential over the junction, thereby increasing the breakdown voltage.

As described herein, the disclosed diode structures use peripheral anode regions to surround and shield a cathode region having a deep cathode portion and shallow cathode extensions, and may be implemented with an efficient and compact layout by separating the anode and cathode contacts with only a shallow trench isolation region. Additional layout efficiencies may be obtained by symmetrically disposing the cathode and anode regions in relation to one another. To illustrate selected embodiments of such a symmetrical arrangement, reference is now made to FIG. 2 which shows a plan layout view 200 of the high voltage diode device in accordance with selected embodiments of the present invention. In the depicted plan layout view 200, the relative positions of the patterned STI regions are illustrated with STI portions 213-216 shown along a lateral axis to provide a reference point for the positioning of the various device regions, though it will be appreciated that each of the patterned STI regions may formed as a single continuous STI structure that loops around the high voltage diode device 100 in positions corresponding to the STI portions 213-216.

As shown in the plan layout view 200, the high voltage diode device includes an active area having an anode contact region 204 symmetrically disposed about a central linear cathode contact region 208. As illustrated, the linear cathode contact region 208 is positioned in an elliptical opening of the anode contact region 204 so as to be separated by the STI regions 214, 215, though other relative positioning and shapes may be used. In addition, the plan layout view 200 shows an outer deep trench region 202 that is formed at the periphery of the diode device to surround and isolate the anode and cathode contact regions 204, 208. In the depicted example, the deep trench region 202 is formed with a mask that covers the active area and the STI regions 213-216. Overlapping with the anode contact region 204, a p-well region 206 is symmetrically disposed to form a peripheral anode region which extends from the deep trench region 202 and partway to the cathode contact region 208. In the depicted example, the p-well region 206 may be formed with an elliptically-shaped mask that covers the cathode contact region 208 and adjacent STI regions 214, 215, along with a portion of the anode contact region 204.

The plan layout view 200 also shows a high energy n-well region 210 that is symmetrically disposed to forma deep cathode region which overlaps with the cathode contact region 208. In some embodiments, the high energy n-well region 210 extends partway to the anode contact region 204. In the depicted example, the high energy region 210 may be formed with mask having an elliptically-shaped opening that exposes the cathode contact region 208 and part of the adjacent STI regions 214, 215. In addition, the plan layout view 200 shows a shallow cathode region 212 that is symmetrically disposed around the deep cathode region 210 to form a cathode extension region which extends from the deep cathode region 210 to the deep trench region 202. In the depicted example, the shallow cathode region 212 may be formed with an elliptically-shaped mask that covers the cathode contact region 208 and part of the adjacent STI regions 214, 215 so that the n-type implant forms the shallow cathode region 212 and counter-dopes any previously-formed anode region 206, but not sufficiently to change the conductivity type of the previously-formed anode region 206. With this configuration, the entire cathode is surrounded on the bottom and sides (and top of the peripheral portions) by the surrounding p-type anode and substrate regions which helps distribute the potential evenly across a large distance, resulting in a high breakdown voltage (e.g., above 50V).

Figure 2:
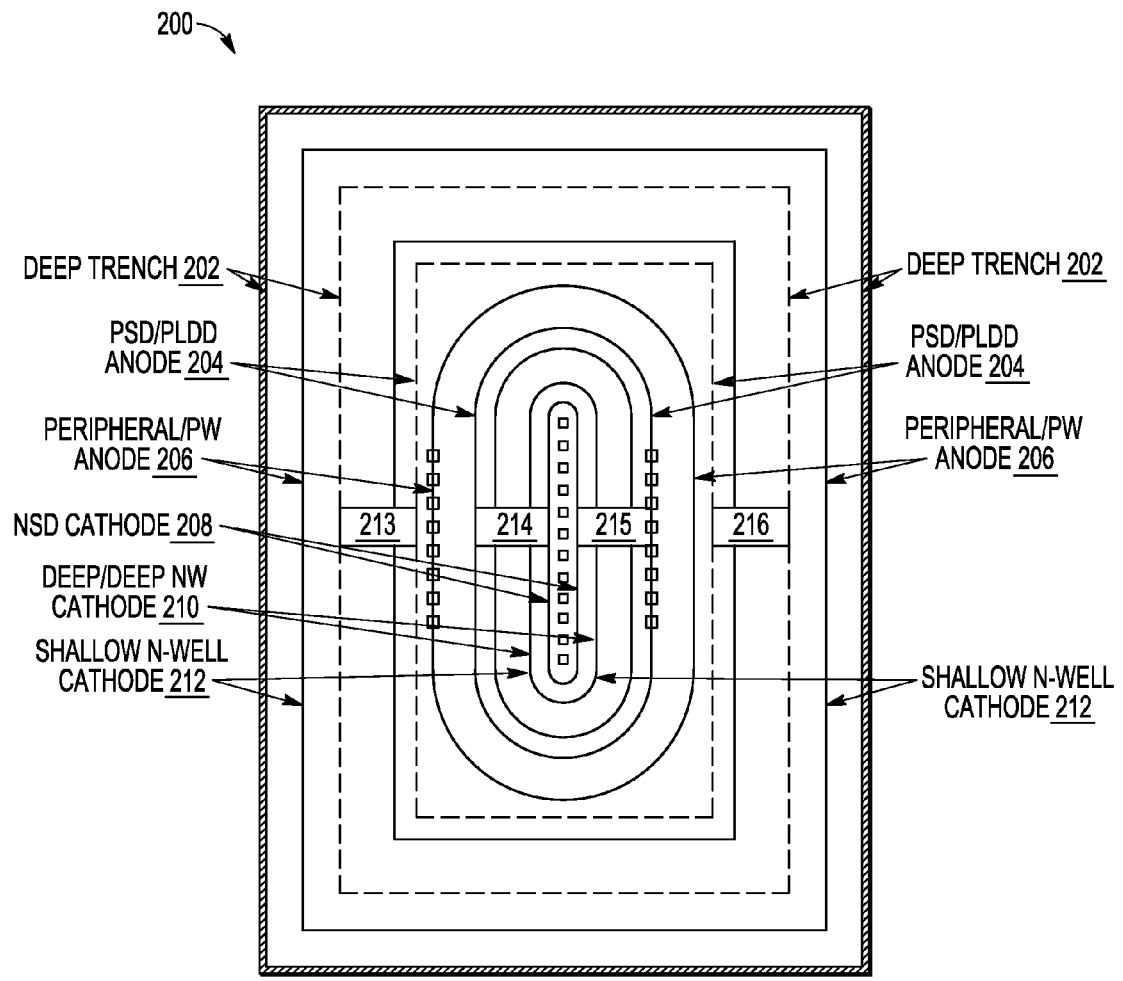
FIG. 2 shows a plan layout view of a high voltage diode device in accordance with selected embodiments of the present invention.

With the layout shown in FIG. 2, one or more racetrack-shaped implant masks are used to form the anode active area 204. In addition, a first elliptically-shaped implant mask may be used with the p-well implant when forming the peripheral anode regions 206, a second elliptically-shaped implant mask may be used with the low energy n-well implant when forming the shallow cathode regions 212, and a third elliptically-shaped implant mask may be used with the PSD/PLDD implants to form the anode contact regions 204. However, it will be appreciated that other termination configurations might achieve high breakdown as well. For example, the anode active area may have a linear shape that is parallel to the cathode active area, though the implant masks still remain elliptically shaped. In other embodiments, linear active areas may be formed with rectangle or ring shaped implant masks with right, or rounded, or shaved corners.

Figure 3:
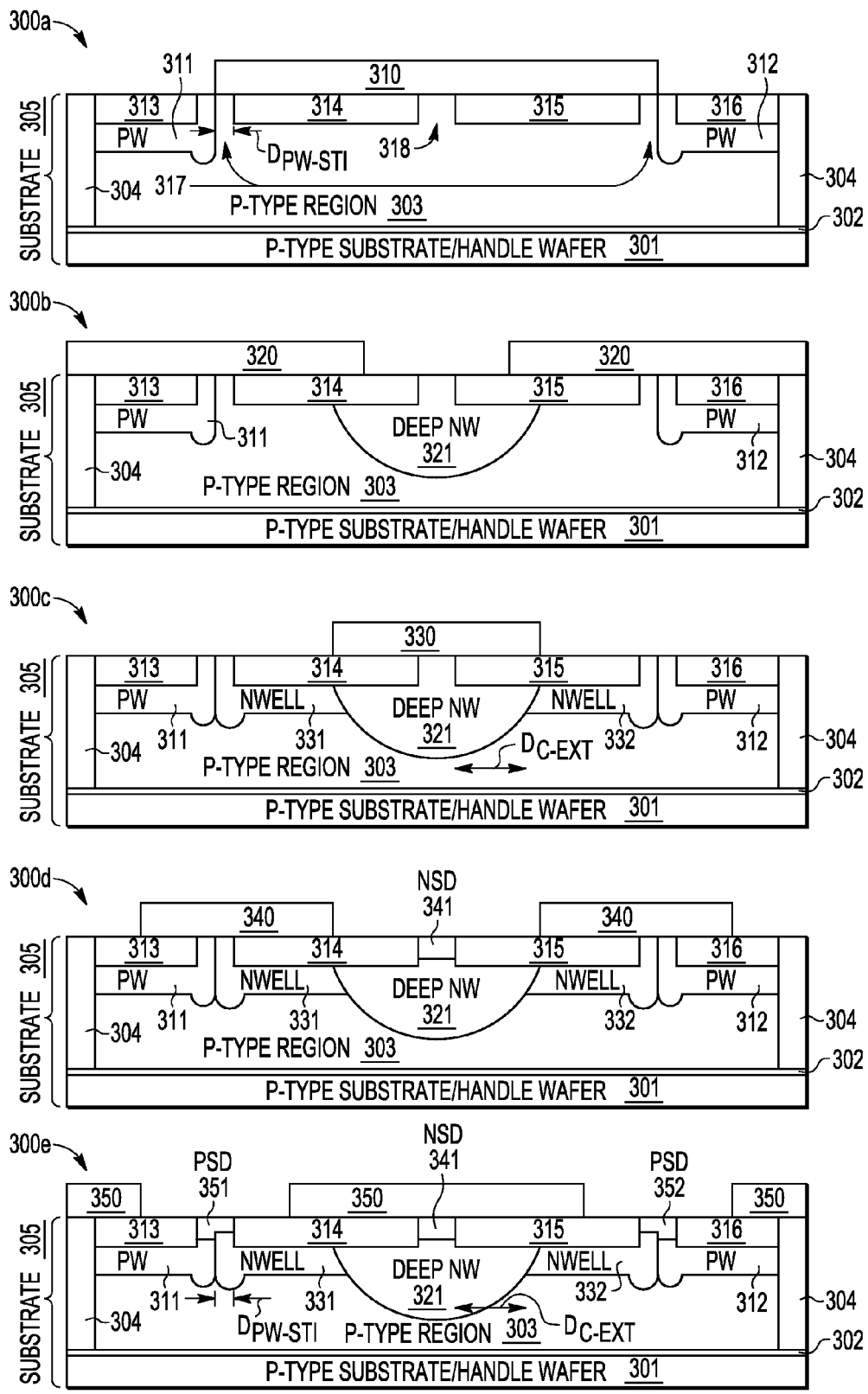
FIG. 3 is a diagrammatic cross-sectional depiction of various manufacturing process steps which may be used to form a high voltage diode device in accordance with various embodiments of the present invention.

The manufacturing process for fabricating high voltage diodes may include further steps that are commonplace in the environment of manufacturing a semiconductor package. For example, FIG. 3 shows diagrammatic cross-sectional depiction of various manufacturing process steps 300a-e which may be used to form a high voltage diode device. As depicted in cross-sectional view 300a, an SOI substrate 305 is provided which includes an n-type substrate or handling wafer 301, a buried insulator or oxide layer 302, and isolated active p-type region 303. The isolated active p-type region 303 is formed on the buried insulator or oxide layer 302, is surrounded on the sides by deep trench isolation structures 304, and is covered by shallow trench isolation structures 313-316 which are patterned to define anode 317 and cathode 318 contact regions. On the substrate 305, a first patterned implant mask 310 is defined to protect the cathode active area, the STI structures 314 and 315, as well as part of anode active area 317 during a p-well implant which penetrates the unmasked STI structures 313, 316 and other part of anode contact regions 317 to form a peripheral anode region 311, 312 in at least part of the anode active area and the region adjacent to the deep trench isolation structures 304. The distance between the implanted peripheral p-type region 311, 312 and the interior STI structures 314, 315 defines a first lateral design parameter ($D_{PW\text{-}STI}$) for the diode device distance from the cathode contact to the peripheral p-type region 311, 312.

As shown in cross-sectional view 300b, a second patterned implant mask 320 is defined to protect the peripheral anode regions 311, 312 and an outer part of the cathode area during a high energy n-well implant which penetrates the unmasked STI structures 314, 315 to form a deep cathode region 321 in the cathode active area so as to extend only part way to the peripheral anode regions 311, 312. In other embodiment, the high energy n-well implant is only disposed within the cathode active area. In the cathode area, the implanted high energy n-well region 321 extends into the p-type region 303 to a controlled depth that will help sustain vertical fields at the diode device. By implanting n-type impurities through the patterned (STI) structures 314, 315, the resulting profile of the deep cathode region 321 may include a profile bulge, and in the absence of any previous counter-doping below cathode contact region 318, the implanted deep cathode region 321 includes an upper portion in the substrate 305 around the subsequently formed N+ cathode contact region(s).

As shown in cross-sectional view 300c, a third patterned implant mask 330 is defined to expose at least the outer part of the cathode area during a low energy n-well implant which penetrates the unmasked STI structures 313-316 to form a shallow cathode region 331, 332 in the cathode area. In selected embodiments, the shallow n-well extends from the deep cathode region 321 to the deep trench isolation 304. In other embodiments, the shallow n-type implant may be disposed in the entire diode area. In the cathode area, the implanted shallow cathode regions 331, 332 extend laterally to a controlled distance that will help sustain high lateral fields at the diode device. To the extent that the peripheral anode regions 311, 312 were previously implanted, the impurity concentration and energy for the shallow cathode region 331, 332 are controlled so that the low energy n-well implant does not counter-dope or overwhelm the anode regions 311 and 312. The implant to form the shallow cathode regions 331, 332 may be disposed in the entire cathode region (including the deep cathode region and the entire anode region), or may be disposed in the entire cathode region except the deep cathode region (and the entire anode region). In the first case, the implant to form the shallow cathode regions 331, 332 overlaps the implant to form the deep cathode region 321. In the second case, the implant to form the shallow cathode regions 331, 332 is adjacent to the implant to form the deep cathode region 321. If the gap between these implants is too big, the cathode region will be discontinuous. In addition, a highest breakdown voltage is usually achieved when the two implants are next to each other. Therefore, there should be no lateral distance between the implants to form the deep cathode region 321 and to form the shallow regions 331, 332. However, the formation of the shallow cathode region 331, 332 is controlled to help define a second lateral design parameter ($D_{C\text{-}EXT}$) as the lateral distance between the cathode contact area 341 and the inner extent of the shallow cathode region 331, 332 ($D_{C\text{-}EXT}$). If the p-well implant has a comparable or even lower doping concentration compared with the shallow n-well implant, the shallow implant mask needs to cover the p-type RESURF region to prevent n-type impurities from reaching the p-type RESURF region.

As shown in cross-sectional view 300d, a fourth patterned implant mask 340 is defined to implant the n-type cathode contact regions 341 while protecting or masking at least the anode contact regions if not the remainder of the active area. In addition and as shown in cross-sectional view 300e, a fifth patterned implant mask 350 is defined to implant the p-type anode contact regions 351, 352 while protecting or masking at least the cathode contact regions 341, if not the remainder of the active area. In selected embodiments, the anode contact regions 351, 352 may be formed with one or more p-type implantation steps, such as a heavy p-type source-drain implant (P++) and another heavy p-type LDD (lightly-doped drain) implant which is disposed in the anode contact region to further, deepen the upper, vertical p-n junction forming part of the anode-cathode junction. As shallow implants, impurities from the PSD and PLDD implants cannot penetrate un-pattered STI. For example, by using the fifth implant mask 350 to implant material having the first conductivity type impurities with one or more implant steps (e.g., P++ sourced/rain and PLDD implants) into the anode contact area in which shallow cathode region 331, 332 of the opposite conductivity type were previously formed, an n-type upper region of the anode contact region may be converted to a p-type surface layer. In this way, the entire cathode region 350, 321, 331, 332 is surrounded by the continuous anode region 303, 311, 312, 351, 352, though it will be appreciated that FIG. 3 shows only one example sequence of processing steps that may be used to build the high voltage diode, so that the implantation steps can be performed in any desired order.

As will be appreciated, the first design parameter ($D_{PW\text{-}STI}$) for the diode device effectively defines the length of p-type upper surface portion of the anode contact regions 351, 352 which may be controlled to increase the breakdown voltage performance, where excessively large spacing distances (e.g., above 1.5 um) or small spacing distances (e.g., less than 0.1 um) for the design parameter $D_{PW\text{-}STI}$ will lower the breakdown voltage. Another design parameter for increasing the breakdown voltage above a minimum threshold (e.g., 50V) is to increase the thickness of the deep trench isolation structures 304 above a minimum thickness (e.g., 1.5 um).

Figure 4:
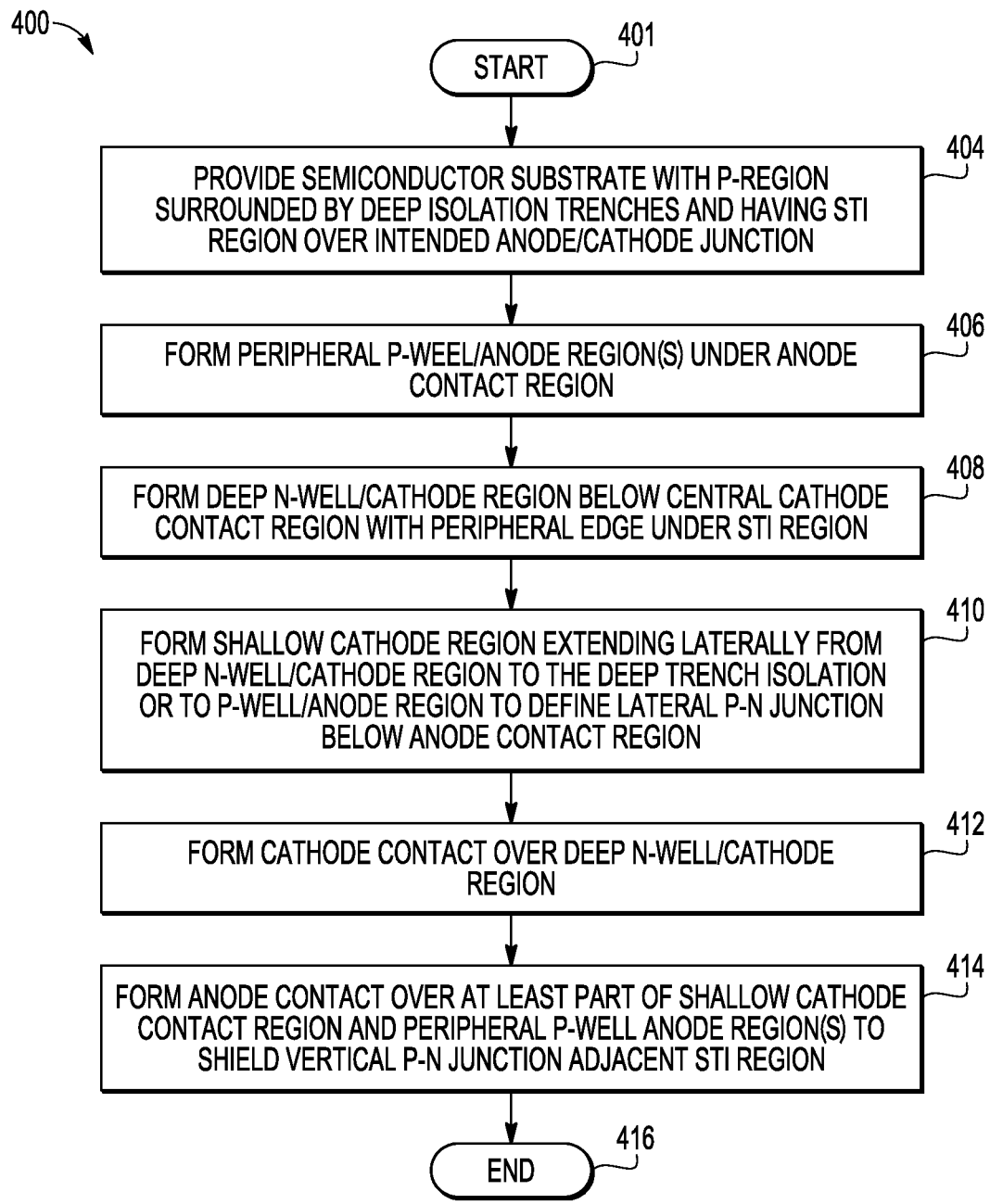
FIG. 4 is a simplified schematic flow chart illustrating various methods for fabricating high voltage diode devices in accordance with selected embodiments of the invention.

FIG. 4 depicts a simplified schematic flow chart illustrating a method 400 for fabricating high voltage diode devices. In describing the Fabrication methodology 400, various reference numbers, doping types and concentrations are provided by way of examples of different regions that can be formed, hut this is intended merely to facilitate understanding of various exemplary embodiments and not by way of limitation. Once the fabrication methodology starts (step 402), a semiconductor substrate is provided at step 404 which has a first semiconductor region that is surrounded by deep trench isolation regions and covered by patterned shallow trench isolation structure(s). The first semiconductor region may be a p-type region having a specified doping concentration (e.g., approximately 2E15 $cm^{-3}$). Unless otherwise indicated, subsequent steps may be provided in any desired order.

In the first semiconductor region, one or more RESURF layers and well regions may be formed to define anode and cathode regions. Starting with step 406, a first peripheral anode region may be formed by implanting an upper p-well to extend from the intended anode contact region to the deep isolation trenches. In an example embodiment, the peripheral anode region is formed with a p-type well implant at a specified doping concentration (e.g., 1E16 to 1E19 $cm^{-3}$). The p-type anode region extends partway under the anode contact region, where the implant mask prevents the other portion of the anode contact region from being implanted.

At step 408, a first n-well region may be implanted to form a deep cathode region which surrounds and extends below the intended cathode contact region by a predetermined depth, and which extends laterally partway under the STI regions. In some embodiments, the deep cathode region may be formed only in the cathode active region. In an example embodiment, the deep n-well cathode region is formed with a high energy implant of n-type impurities at a specified dopant concentration (e.g., 5E15 to 5E17 $cm^{-3}$) using an implant mask to define a peripheral edge under the STI region and to otherwise prevent n-type impurities from reaching the substrate.

At step 410, a second n-well region may be implanted to form a shallow cathode region which extends laterally from the deep n-well cathode region to the deep trench isolation or to the p-well/anode region to define an upper, vertical p-n junction and lateral, horizontal p-n junction below the anode contact region. In an example embodiment, the shallow cathode region is formed with a low energy implant of n-type impurities at a specified dopant concentration (e.g., 5E15 to 5E17 $cm^{-3}$) so as to extend beyond the STI region between the anode and cathode contacts to enhance the breakdown voltage. In selected embodiments, the implantation of n-type impurities is masked to prevent n-type impurities from reaching the deep n-well cathode region. In further embodiments, then-type impurities may be implanted into the entire diode structure or the entire cathode region, including the deep n-well cathode region.

At step 412, implant masks are used to form cathode contact regions proximate to the upper surface of the substrate, such as by implanting impurities of a second conductivity type (e.g., N-type) at a predetermined doping concentration (e.g., N++). As formed, the cathode contact regions are located to be completely contained within or above the deep n-well cathode region. At step 414, implant masks are used to form anode contact regions proximate to the upper surface of the substrate, such as by implanting impurities of the first conductivity type (e.g., P-type) at a predetermined doping concentration (e.g., P++). As formed, the anode contact regions are located over at least part of the shallow cathode region and peripheral anode region to define an upper vertical p-n junction with a peripheral portion of the underlying shallow cathode region which is shielded by the anode contact region. In this way, the anode and cathodes contacts are positioned so that they are spaced apart from one another and separated by the STI region. As depicted, the fabrication methodology 400 ends at step 416.

By now it should be appreciated that there is provided herein a semiconductor diode device and method for fabricating same. The disclosed diode device includes a semiconductor substrate region of a first conductivity type (e.g., p-type) and an isolation structure for electrically isolating the semiconductor substrate region, where the isolation structure includes a deep trench isolation region formed to surround the semiconductor substrate region, a buried insulator layer formed at the bottom of the semiconductor substrate region, and at least a first shallow trench isolation region formed on a surface of the semiconductor substrate region. In the semiconductor substrate region, there is formed a heavily doped first terminal contact region of the first conductivity type (e.g., p-type) and a heavily doped second terminal contact region of a second conductivity type (e.g., n-type) which is spaced apart from the heavily doped first terminal contact region. A first terminal well region of the first conductivity type is formed in the semiconductor substrate region and under a first portion of the heavily doped first terminal contact region. In addition, a second terminal well region of the second conductivity type is formed in the semiconductor substrate region which may include a deep portion located around the heavily doped second terminal contact region and a shallow portion that extends from the deep portion to the first terminal well region, where a peripheral portion of the shallow portion is formed under a second portion of the heavily doped first terminal contact region so that the shallow second terminal well region extends to be located under a portion of the heavily doped first terminal contact region. In selected embodiments, the first terminal well region and shallow portion of the second terminal well region form a lateral, horizontal p-n junction located below the heavily doped first terminal contact region. In addition, the peripheral portion of the second terminal well region and the heavily doped first terminal contact region may form an upper, vertical p-n junction adjacent to the shallow trench isolation region that is shielded by the heavily doped first terminal contact region. In selected embodiments, the first shallow trench isolation region is the only isolation between the heavily doped first terminal and second terminal contact regions, such that the first terminal well region is separated from the first shallow trench isolation region by a first lateral spacing dimension that is controlled to maximize breakdown voltage for the semiconductor diode. In addition, the shallow portion of second terminal well region may be separated from the heavily doped second terminal contact region by a second lateral spacing dimension that is controlled to maximize breakdown voltage for the semiconductor diode. In selected embodiments, the heavily doped first terminal contact region, the first terminal well region, and the underlying semiconductor substrate region enclose the bottom and sides of the second terminal well region. As disclosed, the regions formed with material of the first conductivity type may form the anode terminal (or alternatively, the cathode terminal), and the regions formed with material of the second conductivity type may form the cathode terminal (or alternatively, the anode terminal).

In another form, there is provided a method of fabricating a semiconductor device. In the disclosed methodology, a semiconductor substrate region of a first conductivity type is formed within an isolation structure which has a deep trench isolation region formed to surround the semiconductor substrate region, a buried insulator layer formed at the bottom of the semiconductor substrate region, and at least a first shallow trench isolation region formed on a surface of the semiconductor substrate region. In the semiconductor substrate region, a heavily doped first terminal contact region of the first conductivity type is formed in the first terminal contact area. In addition, a first terminal well region of the first conductivity type is formed in the semiconductor substrate region under at least the first terminal contact area to be in ohmic contact with the first terminal contact region as finally formed. In addition, a heavily doped second terminal contact region of a second conductivity type is formed in a second terminal contact area to be spaced apart from the heavily doped first terminal contact region. In addition, a second terminal well region of the second conductivity type is formed in the semiconductor substrate region under at least the second terminal contact area to be in ohmic contact with the second terminal contact region as finally formed, where the second terminal well region extends laterally to a peripheral end portion that is located under the first terminal contact area of the semiconductor substrate region and that is adjacent to the first terminal well region as finally formed. In selected embodiments, the second terminal well region is formed by implanting into the semiconductor substrate region a deep terminal well region and a shallow terminal well region of the second conductivity type, where the deep terminal well region surrounds or sits below the heavily doped second terminal contact region, and the shallow terminal well region extends laterally from the deep second terminal well region to a peripheral end portion located under a first terminal contact area of the semiconductor substrate region. When implanted, the shallow terminal well region is separated from the heavily doped second terminal contact region by a second lateral spacing dimension that is controlled to maximize breakdown voltage for the semiconductor diode device. As formed, a shallow trench isolation region separates the heavily doped second terminal and first terminal contact regions so that, when the first terminal well region is implanted with an implant mask, the first terminal well region is separated from the shallow trench isolation region by a first lateral spacing dimension that is controlled to maximize breakdown voltage for the semiconductor diode device. While the various regions may be formed in any desired order, the cathode-anode junction formed between the first terminal well region and second terminal well region is shielded by the heavily doped first terminal contact region to enhance charging immunity. In addition, the first terminal well region, the heavily doped first terminal contact region, and the underlying semiconductor substrate region may be formed to completely enclose the bottom and sides of the second terminal well region. In selected embodiments, regions formed with material of the first conductivity type are formed as n-type or alternatively p-type regions, and regions formed with material of the second conductivity type are formed as p-type or alternatively n-type regions, respectively.

In yet another form, there is provided a method forming a high voltage diode device. In the disclosed methodology, a semiconductor-on-insulator substrate is provided that includes a semiconductor substrate layer formed over a buried insulator layer and surrounded by a deep trench isolation region. On the substrate layer, shallow trench isolation regions are formed to define a first terminal contact opening separate from a second terminal contact opening by a first shallow trench isolation region. In any desired order, the following steps are applied. In the first terminal contact opening, a heavily doped first terminal contact region of a first conductivity type is selectively implanted. In addition, a deep first terminal well region of the first conductivity type is selectively implanted in the substrate layer around the heavily doped first terminal contact region of the first conductivity type. In addition, a shallow first terminal well region of the first conductivity type is selectively implanted in the substrate layer to extend laterally to a peripheral end portion located under the second terminal contact opening. In addition, a heavily doped second terminal contact region of the second conductivity type is selected implanted in the substrate layer in the second terminal contact opening so as to be spaced apart and separated from the heavily doped first terminal contact region of the first conductivity type by the first shallow trench isolation region. In addition, a peripheral second terminal well region of a second conductivity type is selectively implanted in the substrate layer under the second terminal contact area to be positioned adjacent to the peripheral end portion of the shallow first terminal well region as finally formed. As formed, the peripheral second terminal well region of the second conductivity type and heavily doped second terminal contact region of the second conductivity type form a p-type RESURF layer in the substrate layer adjacent to the shallow first terminal well region of the first conductivity type which form an n-type RESURF layer. In addition, the selective implantation of the peripheral second terminal well region of the second conductivity type and heavily doped second terminal contact region of the second conductivity type form a cathode-anode junction in the substrate layer below the second terminal contact opening that is shielded by the heavily doped second terminal contact region of the second conductivity type to enhance charging immunity. In selected embodiments, the heavily doped first terminal contact region, deep first terminal well region, and shallow first terminal well region are formed as n-type regions, and the peripheral second terminal well region and heavily doped second terminal contact region are formed as p-type regions. In other embodiments, the heavily doped first terminal contact region, deep first terminal well region, and shallow first terminal well region are formed as p-type regions, and the peripheral second terminal well region and heavily doped second terminal contact region are formed as n-type regions.

Although the described exemplary embodiments disclosed herein are directed to various high voltage diode devices and methods for making same, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various diode devices are illustrated as being formed in a p-type substrate layer, this is merely for convenience of explanation and not intended to be limiting and persons of skill in the art will understand that the principles taught herein apply to devices of either conductivity type. Accordingly, the identification of particular regions as N-type or P-type is merely by way of illustration and not limitation and opposite conductivity type regions my be substituted in order to form devices of opposite conduction type. Moreover, the thicknesses and doping concentrations of the described layers may deviate from the disclosed ranges or values. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor diode device, comprising:
   a semiconductor substrate region;
   an isolation structure for electrically isolating the semiconductor substrate region;
   a heavily doped first terminal contact region of a first conductivity type formed in the semiconductor substrate region;
   a heavily doped second terminal contact region of a second conductivity type located in the semiconductor substrate region to be spaced apart from the heavily doped first terminal contact region;
   a first terminal well region of the first conductivity type located in the semiconductor substrate region and under a first portion of the heavily doped first terminal contact region; and
   a second terminal well region of the second conductivity type located in the semiconductor substrate region comprising a deep portion located around the heavily doped second terminal contact region and a shallow portion that extends from the deep portion to the first terminal well region, where a peripheral portion of the shallow portion is located under a second portion of the heavily doped first terminal contact region.

2. The semiconductor diode device of claim 1, where the first conductivity type is p-type, and the second conductivity type is n-type.

3. The semiconductor diode device of claim 1, where the first terminal well region and shallow portion of the second terminal well region form a p-n junction located below the heavily doped first terminal contact region.

4. The semiconductor diode device of claim 1, where the peripheral portion of the second terminal well region and the heavily doped first terminal contact region form a vertical p-n junction that is shielded by the heavily doped first terminal contact region.

5. The semiconductor diode device of claim 1, where a shallow trench isolation region located on a surface of the semiconductor substrate region is the only isolation between the heavily doped first terminal and second terminal contact regions.

6. The semiconductor diode device of claim 1, where the first terminal well region is separated from a shallow trench isolation region formed on a surface of the semiconductor substrate region by a lateral spacing dimension that is controlled to maximize breakdown voltage for the semiconductor diode device.

7. The semiconductor diode device of claim 1, where the shallow portion of the second terminal well region is separated from the heavily doped second terminal contact region by a lateral spacing dimension that is controlled to maximize breakdown voltage for the semiconductor diode device.

8. The semiconductor diode device of claim 1, where the heavily doped first terminal contact region, first terminal well region, and underlying semiconductor substrate region enclose the bottom and sides of the second terminal well region.

9. The semiconductor diode device of claim 1, where the isolation structure comprises a deep trench isolation region formed to surround the semiconductor substrate region, a buried insulator layer formed at the bottom of the semiconductor substrate region, and at least a first shallow trench isolation region formed on a surface of the semiconductor substrate region.

10. An integrated circuit device, comprising:
a semiconductor substrate region of a first conductivity type;
a heavily doped first terminal contact region of the first conductivity type located in a first terminal contact area of the semiconductor substrate region;
a heavily doped second terminal contact region of a second conductivity type located in a second terminal contact area of the semiconductor substrate region to be spaced apart from the first terminal contact area by a shallow trench isolation region;
a first terminal extension region of the first conductivity type located in the semiconductor substrate region under at least the heavily doped first terminal contact region to be in ohmic contact with the first terminal contact region; and
a second terminal extension region of the second conductivity type located in the semiconductor substrate region under at least the heavily doped second terminal contact region to be in ohmic contact with the second terminal contact region, where the second terminal extension region extends laterally to a peripheral end portion that is located under the heavily doped first terminal contact region and that is adjacent to the first terminal extension region.

11. The integrated circuit device of claim 10, further comprising an isolation structure for electrically isolating the semiconductor substrate region comprising a deep trench isolation region and a buried insulation layer formed around the semiconductor substrate region.

12. The integrated circuit device of claim 10, where the heavily doped first terminal contact region and first terminal extension region form either an anode terminal or a cathode terminal of a diode, and where the heavily doped second terminal contact region and the second terminal extension region form, respectively, either a cathode terminal or an anode terminal of the diode.

13. The integrated circuit device of claim 10, wherein the first terminal extension region and second terminal extension region form a lateral p-n junction at a bottom surface of the heavily doped first terminal contact region.

14. The integrated circuit device of claim 13, where the lateral p-n junction is shielded by the heavily doped first terminal contact region to enhance charging immunity.

15. The integrated circuit device of claim 10, where the first terminal extension region, the heavily doped first terminal contact region, and underlying semiconductor substrate region completely enclose the bottom and sides of the second terminal extension region.

16. The integrated circuit device of claim 10, where the integrated circuit device comprises a high voltage diode device.

17. The integrated circuit device of claim 10, where the second terminal extension region comprises:
a deep terminal well region of the second conductivity type in the semiconductor substrate region around the heavily doped second terminal contact region; and
a shallow terminal well region of the second conductivity type in the semiconductor substrate region to extend laterally from the deep terminal well region to a peripheral end portion located under the heavily doped first terminal contact region.

18. A high voltage RESURF diode device, comprising:
a semiconductor-on-insulator (SOI) substrate;
a cathode region located in the SOI substrate and comprising a cathode contact;
an anode region located in the SOI substrate and comprising an anode contact; and
at least a first shallow trench isolation region located on a surface of the SOI substrate to separate the cathode contact from the anode contact,
where the cathode region comprises a deep terminal well region formed around the cathode contact and a shallow terminal well region which extends laterally from the deep terminal well region and above at least part of the anode region to a peripheral end portion that is located under the anode contact such that the shallow terminal well region and the anode region define a vertical p-n junction and a lateral p-n junction below the anode contact.

19. The high voltage RESURF diode device of claim 18, where the anode region comprises a well tie region and a buried RESURF layer to deplete the cathode region.

20. The high voltage RESURF diode device of claim 19, where the lateral p-n junction is shielded by the anode contact against surface charging.

* * * * *